United States Patent [19]

Golubic et al.

[11] Patent Number: 4,994,897
[45] Date of Patent: Feb. 19, 1991

[54] MULTI-LEVEL SEMICONDUCTOR PACKAGE

[75] Inventors: Theodore R. Golubic; Frank E. Polka, both of Phoenix; Brian A. Webb, Mesa, all of Ariz.

[73] Assignee: Motorola, Inc., Schaumburg, Ill.

[21] Appl. No.: 427,056

[22] Filed: Oct. 26, 1989

[51] Int. Cl.⁵ .................................. H01L 23/02
[52] U.S. Cl. ............................. 357/81; 357/72; 357/65
[58] Field of Search ........................ 357/81, 72, 65

[56] References Cited

U.S. PATENT DOCUMENTS 4,032,706 6/1977 Paletto .................................. 357/72
4,132,856 1/1979 Hutchison et al. .................. 357/81
4,807,018 2/1989 Cellai .................................. 357/81

Primary Examiner—Jerome Jackson, Jr.
Assistant Examiner—Reginald Ratliff
Attorney, Agent, or Firm—Joe E. Barbee, Miriam Jackson

[57] ABSTRACT

A single-in-line semiconductor package uses a multi-level heatsink having patterned conductors surrounding the semiconductor device. The patterned conductors are electrically isolated from the heatsink. Short bond wires are used to connect the semiconductor device to the patterned conductors. This arrangement eliminates the need for bonding shelves when bonding the leads and also increases the resistance of the bond wires from being swept away during encapsulation.

9 Claims, 1 Drawing Sheet

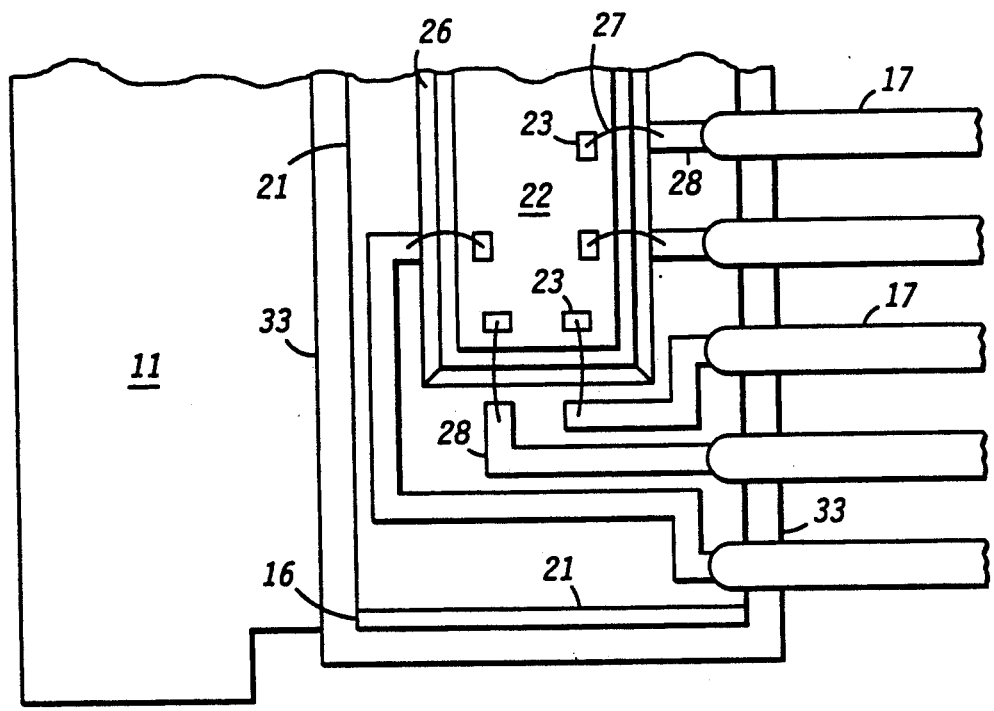
FIG. 1
FIG. 2
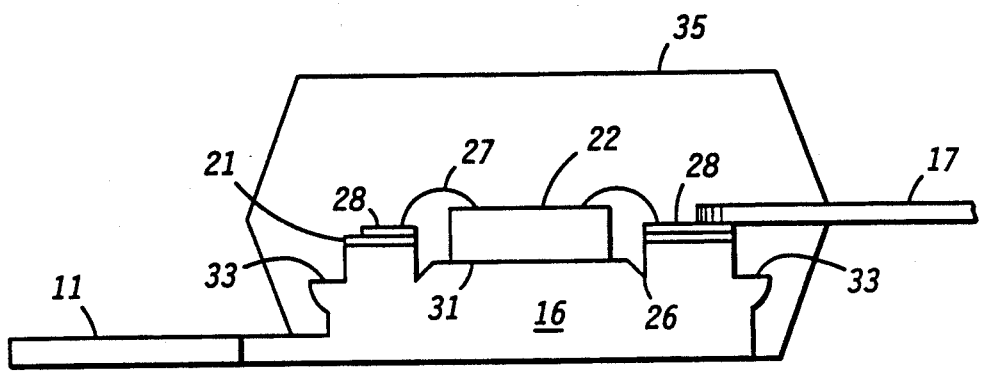

MULTI-LEVEL SEMICONDUCTOR PACKAGE

BACKGROUND OF THE INVENTION

This invention relates, in general, to semiconductor packages, and more particularly, to a single-in-line semiconductor package having a multi-level heatsink.

There are a large number of semiconductor packages. These packages are in various shapes and sizes and contain anywhere from two interface leads on up. The number of interface leads is generally controlled by the complexity of the semiconductor device housed in the package. One of the constraints of semiconductor packages is that semiconductor customers prefer to use standard packages such as approved by JEDEC. Recently, power packages (those packages housing semiconductor devices that generate a considerable amount of power) are being housed in a package having a set of interface leads protruding from only one side of the power package. This configuration is commonly referred to as a single-in-line package.

Also, more control circuitry is being placed on the same piece of silicon as the power device. This results in a greater number of interface pins being required. One such power package has been made having an aluminum or copper substrate covered by a glass or ceramic impregnated epoxy or polymer layer. A copper foil is patterned into several separate pieces on this insulating layer. On one piece of the copper foil is placed a solid heat spreader. A semiconductor device is then mounted on the solid heat spreader. Small wires are then bonded between the semiconductor device and individual strips of copper foil to which the interface leads are soldered. This provided a high power package; however, one of the disadvantages was assembling the individual pieces. As an example, the solid heat spreader must be positioned on a copper foil and bonded thereto.

Accordingly, it is an object of the present invention to provide an improved single-in-line semiconductor package.

Another object of the present invention is to provide a multi-level semiconductor package which requires a minimum of handling to assembly.

Yet another object of the present invention is to provide a semiconductor package having shorter wire bonds thereby increasing the resistance to wire sweep.

Yet a further object of the present invention is to provide a semiconductor package having improved hermeticity of the package by positive locking between the heatsink of the package and the encapsulating plastic.

SUMMARY OF THE INVENTION

The above and other objects and advantages of the present invention are provided by a multi-level heatsink having at least a first and a second level. A plurality of leads are positioned adjacent to the second level. A semiconductor device is located on the second level and surrounded by conductors which are isolated from the second level. The conductors are electrically connected to the semiconductor device and to the leads. In a preferred embodiment, the second level has at least one protrusion for gripping an encapsulating material used to encapsulate the semiconductor device and the second level.

BRIEF DESCRIPTION OF THE DRAWINGS

FIG. 1 illustrates an enlarged top view of a portion of the present package before encapsulation; and FIG. 2 illustrates a cross-sectional side view of the present invention.

DETAILED DESCRIPTION OF THE DRAWINGS

FIG. 1 illustrates, in pictorial form, a portion of a semiconductor package in accordance with the present invention prior to encapsulation. Pedestal 16 has an insulating layer 21 covering most of the top surface of pedestal 16. A plurality of conductive lines or leads 28 are patterned on insulating layer 21. Insulating layer 21 serves to electrically isolate patterned leads 28 from pedestal 16. Insulating layer 21 is illustrated as a single layer but could be a multi-layer arrangement having one or more patterned conductive layers therein; In some situations it may be desirable for one or more of leads 28 to be in contact with pedestal 16. In such a case, an opening is provided in insulating tape or layer 16. A semiconductor device 22 having ohmic contacts 23 is positioned on pedestal 16. Semiconductor device 22 can be surrounded by a groove or trench 26 which serves to limit solder runout from beneath semiconductor device 22. Solder, or any suitable adhesive, is used to bond device 22 to raised pedestal 16. Electrical connection is made from ohmic contacts 23 to patterned conductors 28 by bonding wires 27. Leads 17 also make electrical contact to patterned conductors 28. By using patterned conductors 28, bonding wires 27 can be kept short which increases their resistance to being swept away when the encapsulating material is applied and also enhances signal speeds during operation of semiconductor device 22.

Only one semiconductor device 22 is illustrated on heatsink pedestal 16 in FIG. 1; however, it will be understood that multiple semiconductor devices can be accommodated by pedestal 16. Therefore, by using the same heatsink and lead arrangement, insulating layer 21 can be patterned to accommodate one or more semiconductor devices. This improves the flexibility of the present packaging arrangement.

FIG. 2 is a cross-sectional side view of the present invention. Note that pedestal 16 is an integral part of heatsink portion 11. This eliminates any extra handling or positioning of pedestal 16 onto heatsink 11. In addition, note that pedestal 16 has protrusions 33 to improve the gripping power to encapsulating material 35 and to provide better hermeticity. Encapsulating material 35 surrounds pedestal 16, semiconductor device 22, and a portion of leads 17. Encapsulating material 35 can be any suitable material well known in the art. Semiconductor device 22 is shown as being in a cavity or recess 31. Recess or depression 31 is optional and is shown as having a trench 26 surrounding semiconductor device 22. Trench 26 will collect any solder runout from beneath semiconductor device 22. Pedestal 16 eliminates the need for a shelf support beneath leads 17 during bonding of leads 17 to patterned conductors 28. FIG. 3 illustrates leads 17 as being insulated from pedestal 16; however, in some applications it may be desirable to have electrical contact between one or more leads 17 to pedestal 16. In such cases, this can easily be done by providing an opening through carrier film 21 using well known techniques to provide conductive contact between conductive line 28 and pedestal 16 thereby providing electrical contact between pedestal 16 and lead 17.

By now it should be appreciated that there has been provided a versatile packaging arrangement housed in a standard JEDEC outline. This packaging arrangement is compatible with tab and flip-tab assembly. Shorter wire bonds increase the resistance to wire sweep during encapsulation. The integral two-level heatsink improves manufacturability and improves power dissipation since heat spreader (flat lower level) 11 and pedestal 16 are one continuous piece with the heat spreader continuing in a flat configuration beneath the pedestal. The heatsink pedestal arrangement eliminates the requirement for sliding bond shelves and multi-level clamping during assembly. In addition, wire bond terminations can be made on all four sides of the semiconductor device and still have all the leads come out from one side of the finished package. The direct bonding of the semiconductor device to the heatsink pedestal also increases heat removal efficiency.

We claim:

1. A multi-level single-in-line semiconductor package, comprising: a heatsink having a pedestal on top of the heatsink for receiving a semiconductor device; and insulator on the pedestal and having patterned conductors on a top surface of the insulator; wires for making electrical connections between the patterned conductors and the semiconductor device; a plurality of leads connected and the patterned conductors; and encapsulating material surrounding the pedestal, semiconductor device, insulator, wires, and a portion of the leads, and wherein the pedestal has protrusions for gripping the encapsulating material.

2. The semiconductor package of claim 1 wherein the remaining portion of the plurality of leads not surrounded by the encapsulating material all extend from one side of the semiconductor package, and wherein the heatsink and pedestal are a unitary piece forming a flat lower surface.

3. A semiconductor package, comprising: a multi-level heatsink having a heat spreading portion and a raised pedestal on top of the heatsink thereby forming the multi-level heatsink; a semiconductor device mounted on the pedestal; patterned conductors surrounding the semiconductor device and isolated from the pedestal; connecting means between the patterned conductors and the semiconductor device; a plurality of leads connected to the patterned conductors and extending away from the pedestal; and an encapsulate encapsulating the pedestal, semiconductor device and a portion of the leads, wherein the pedestal has protrusions for gripping the encapsulating material.

4. The semiconductor package of claim 3 wherein the pedestal has a depression for accommodating the semiconductor device.

5. The semiconductor package of claim 3 wherein at least one of the leads is electrically connected to the pedestal.

6. A semiconductor package having a leadframe, wherein the leadframe has a heatsink having a first and a second level and a plurality of leads adjacent to the second level and wherein the second level is positioned on top of the first level; a semiconductor device located on the second level; and patterned conductors surrounding the semiconductor device and being isolated from the second level, wherein the patterned conductors are electrically connected to the semiconductor device and the leads, and further wherein the second level has protrusions for gripping an encapsulating material.

7. The semiconductor package of claim 6 wherein the isolated patterned conductors comprise an insulating layer having metallic leads thereon.

8. The semiconductor package of claim 7 wherein the second level forms a pedestal which is electrically and thermally common with the first level and wherein the insulating layer also has metallic leads therein.

9. The semiconductor package of claim 6 wherein the plurality of leads adjacent to the second level all extend from the semiconductor package in the same direction.

* * * * *

UNITED STATES PATENT AND TRADEMARK OFFICE
CERTIFICATE OF CORRECTION

PATENT NO. : 4,994,897

DATED : February 19, 1991

INVENTOR(S) : Golubic et al

It is certified that error appears in the above-identified patent and that said Letters Patent is hereby corrected as shown below:

Column 3, claim 1, line 24, change "and" to --an--.

Signed and Sealed this

Eighth Day of December, 1992

Attest:

DOUGLAS B. COMER

Attesting Officer

Acting Commissioner of Patents and Trademarks

UNITED STATES PATENT AND TRADEMARK OFFICE
CERTIFICATE OF CORRECTION

PATENT NO. : 4,994,897

DATED : February 19, 1991

INVENTOR(S) : Theodore Golubic et al

It is certified that error appears in the above-identified patent and that said Letters Patent is hereby corrected as shown below:

Column 3, claim 1, line 29, change the <u>first occurrence of</u> "and" to --to--.

Signed and Sealed this

Fifth Day of October, 1993

*Attest:*

BRUCE LEHMAN

*Attesting Officer*    *Commissioner of Patents and Trademarks*